(12) United States Patent
Tseng et al.

(10) Patent No.: US 11,289,433 B2
(45) Date of Patent: Mar. 29, 2022

(54) SEMICONDUCTOR DEVICE PACKAGES AND METHODS OF MANUFACTURING THE SAME

(71) Applicant: Advanced Semiconductor Engineering, Inc., Kaohsiung (TW)

(72) Inventors: Chi Sheng Tseng, Kaohsiung (TW); I Hung Wu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/740,168

(22) Filed: Jan. 10, 2020

(65) Prior Publication Data

US 2020/0227365 A1 Jul. 16, 2020

Related U.S. Application Data

(60) Provisional application No. 62/792,295, filed on Jan. 14, 2019.

(51) Int. Cl.

| H01L 23/66 | (2006.01) |
| H01L 23/053 | (2006.01) |
| H01L 23/498 | (2006.01) |
| H01L 23/552 | (2006.01) |
| H01L 23/00 | (2006.01) |
| H01L 21/48 | (2006.01) |
| H01Q 1/22 | (2006.01) |

(52) U.S. Cl.
CPC .......... *H01L 23/66* (2013.01); *H01L 21/4817* (2013.01); *H01L 21/4853* (2013.01); *H01L 21/4857* (2013.01); *H01L 23/053* (2013.01); *H01L 23/49822* (2013.01); *H01L 23/49838* (2013.01); *H01L 23/552* (2013.01); *H01L 23/564* (2013.01); *H01L 24/16* (2013.01); *H01Q 1/2283* (2013.01); *H01L 2223/6677* (2013.01); *H01L 2224/16227* (2013.01); *H01L 2924/3025* (2013.01)

(58) Field of Classification Search
None
See application file for complete search history.

(56) References Cited

U.S. PATENT DOCUMENTS

| 9,153,863 | B2 * | 10/2015 | Nair | H01Q 1/38 |
| 9,620,464 | B2 * | 4/2017 | Baks | H01Q 19/10 |
| 9,985,346 | B2 * | 5/2018 | Baks | H01L 23/66 |
| 2008/0291115 | A1 * | 11/2008 | Doan | H01Q 21/0087 |
| | | | | 343/893 |
| 2010/0327068 | A1 * | 12/2010 | Chen | H01L 23/66 |
| | | | | 235/492 |

(Continued)

*Primary Examiner* — Long Pham
(74) *Attorney, Agent, or Firm* — Foley & Lardner LLP

(57) ABSTRACT

A semiconductor package structure includes a carrier, an antenna element, an electronic component, and a conductive structure. The antenna element, which includes an exposed portion, is disposed on the carrier. The conductive structure is disposed between the carrier and the exposed portion of the antenna element. The conductive structure electrically connects the electronic component to the carrier. The carrier, the exposed portion of the antenna element, and the conductive structure define an air space to accommodate the electronic component and to space the electronic component apart from the conductive structure.

20 Claims, 19 Drawing Sheets

(56) References Cited

U.S. PATENT DOCUMENTS

| | | | |
|---|---|---|---|
| 2013/0189935 A1* | 7/2013 | Nair | H01Q 1/2283 |
| | | | 455/90.2 |
| 2016/0049723 A1* | 2/2016 | Baks | H01Q 1/2291 |
| | | | 343/848 |
| 2017/0125895 A1* | 5/2017 | Baks | H01L 23/66 |
| 2018/0049351 A1* | 2/2018 | Yu | H05K 1/0236 |
| 2019/0229433 A1* | 7/2019 | Labonte | H01Q 9/0457 |
| 2020/0227365 A1* | 7/2020 | Tseng | H01L 23/49822 |

* cited by examiner

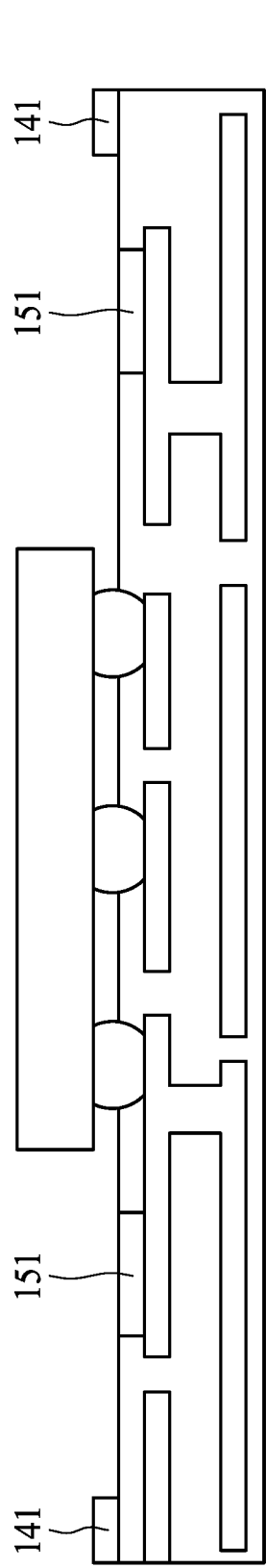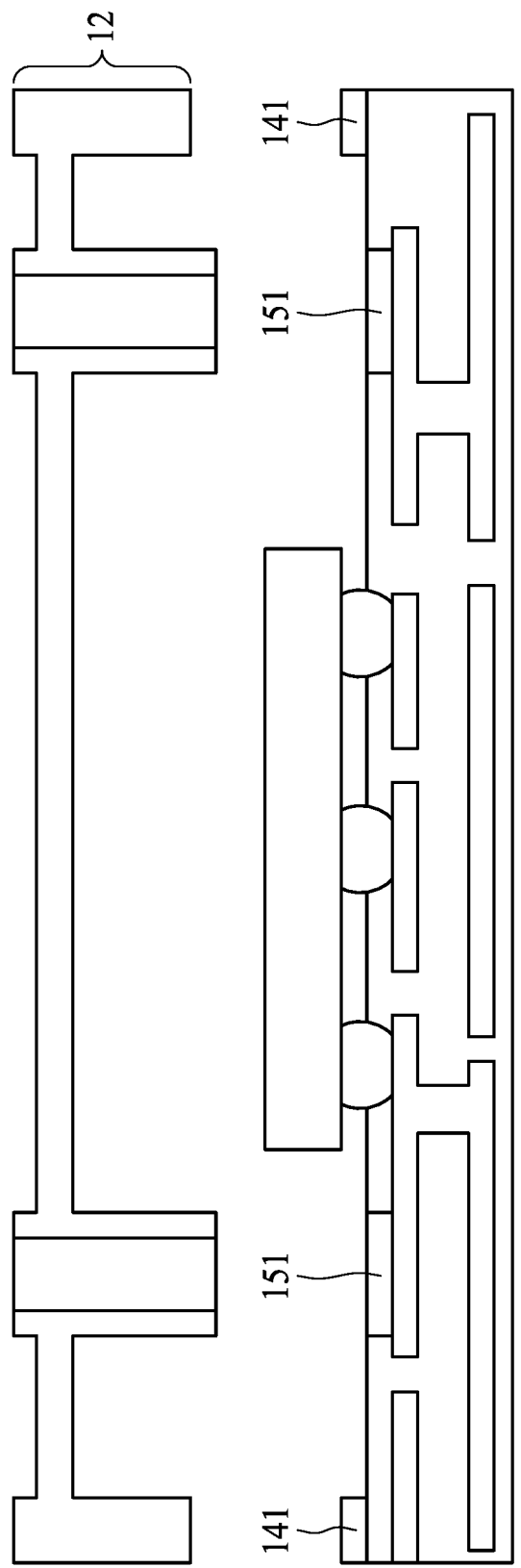

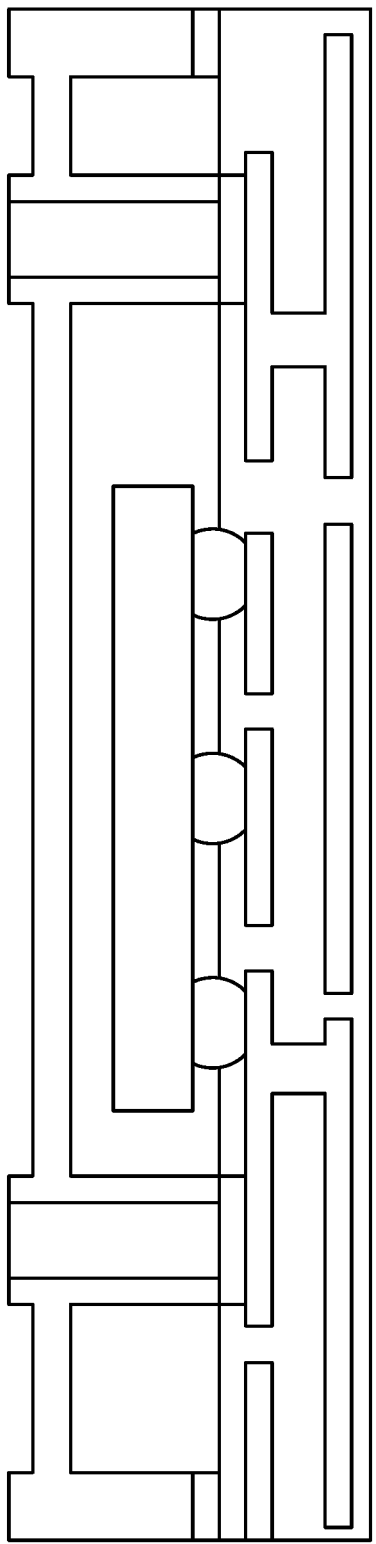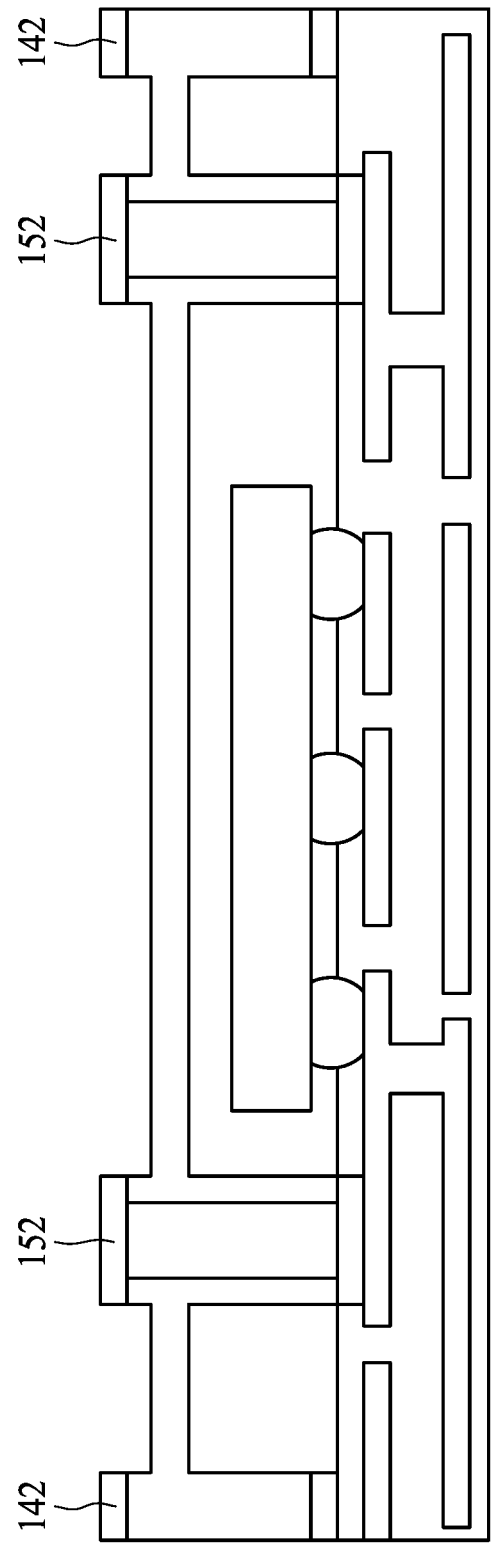

SEMICONDUCTOR DEVICE PACKAGES AND METHODS OF MANUFACTURING THE SAME

CROSS-REFERENCE TO RELATED APPLICATIONS

This application claims the benefit of and priority to U.S. Provisional Application No. 62/792,295, filed Jan. 14, 2019, the contents of which are incorporated herein by reference in their entirety.

BACKGROUND

1. Technical Field

The present disclosure relates to semiconductor device packages.

2. Description of the Related Art

A semiconductor device package can include a semiconductor device disposed on a carrier, and an antenna structure disposed on the semiconductor device. The antenna structure may include a single conductive pattern or multi-layer conductive patterns in dielectric material.

However, dielectric material can adversely affect performance of the semiconductor device package.

SUMMARY

In some embodiments, the present disclosure provides a semiconductor device package, which includes a carrier, an antenna element, an electronic component, and a conductive structure. The antenna element, which includes an exposed portion, is disposed on the carrier. The conductive structure is disposed between the carrier and the exposed portion of the antenna element. The conductive structure electrically connects the electronic component to the carrier. The carrier, the exposed portion of the antenna element, and the conductive structure define an air space to accommodate the electronic component and to space the electronic component apart from the conductive structure.

In some embodiments, the present disclosure provides a semiconductor device package, which includes a carrier, an antenna element, an electronic component, and a lid. The antenna element, which includes an exposed portion, is disposed on the carrier. The lid is disposed between the carrier and the antenna element. The lid covers the electronic component. The lid electrically connects the exposed portion of the antenna element to the carrier.

In some embodiments, the present disclosure provides a method of manufacturing a semiconductor device package, which includes: disposing a semiconductor device on a carrier; disposing a lid on the carrier to cover the semiconductor device; and disposing an antenna element on the lid to define an air space between the lid and the antenna element.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

FIG. 4A, FIG. 4B, FIG. 4C, FIG. 4D, FIG. 4E, FIG. 4F and FIG. 4G show operations of manufacturing a semiconductor device package at various stages in accordance with some embodiments of the subject application.

DETAILED DESCRIPTION

Figure 1:
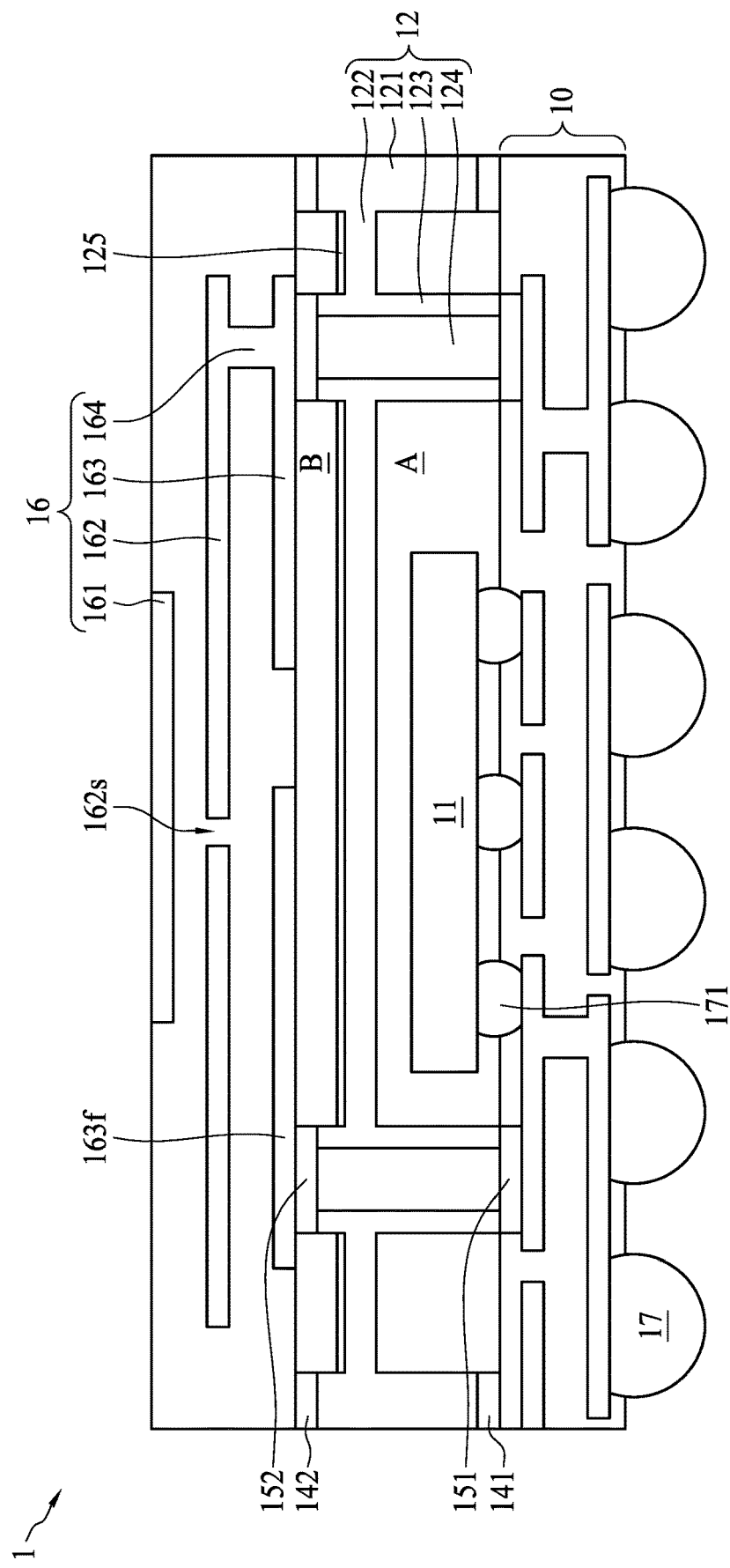
FIG. 1 illustrates a semiconductor device package in accordance with some embodiments of the subject application.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

FIG. 1 illustrates a semiconductor device package in accordance with some embodiments of the subject application.

Referring to FIG. 1, a semiconductor device package 1 includes a carrier 10, an electronic component 11, a lid 12, an antenna element 16 and connection elements 17.

The carrier 10 may include a substrate. The carrier 10 may include a circuitry. The carrier 10 may include conductive pad(s), trace(s), and interconnection(s) (e.g. conductive via(s)). The carrier 10 may include a redistribution layer (RDL) structure. The carrier 10 may include ceramic, semiconductor material, dielectric material (e.g. epoxy-based material (e.g. FR4), resin-based material (e.g. Bismaleimide-Triazine (BT))), pre-impregnated materials (e.g. prepregs or pp), glass or other suitable materials.

The electronic component 11 is disposed on the carrier 10. The electronic component 11 is electrically connected to the carrier 10.

The electronic component 11 may include but is not limited to, for example, a semiconductor device. The electronic component 11 may include but is not limited to, for example, an integrated circuit (IC), a semiconductor die or chip having circuitry therein, a radio frequency (RF) die, a Microelectromechanical Systems (MEMS) device, a power die, a power controller, an amplifier, a filter, a sensor, etc. The electronic component 11 is supported by the carrier 10. The electronic component 11 is bonded or attached to the carrier 10 by connection elements (not denoted in FIG. 1). The electronic component 11 is bonded or attached to conductive pads (not denoted in FIG. 1) of the carrier 10 by connection elements (not denoted in FIG. 1). Although one electronic component 11 is shown in FIG. 1 for simplicity, it is contemplated that the semiconductor device package 1 may include more electronic component(s) 11.

Although FIG. 1 merely illustrates the electronic component 11 for simplicity, it is contemplated that the semiconductor device package 1 may include other electronic components, which may include but is not limited to, for example, a passive component (e.g. resistor, capacitor, inductor, transformer, etc.).

The lid 12 is disposed on the carrier 10. The lid 12 covers the electronic component 11. The lid 12 includes sidewall 121, plate 122, sidewalls 123 and conductive structure 124.

The lid 12 is attached to the carrier 10 by conductive adhesive or solder material 151. The conductive adhesive or solder material 151 is disposed between the sidewall 123 and the conductive pad (not denoted in FIG. 1) of the carrier 10. The conductive adhesive or solder material 151 is disposed between the conductive structure 124 and the conductive pad (not denoted in FIG. 1) of the carrier 10.

The lid 12 is attached to the carrier 10 by non-conductive adhesive 141. The conductive adhesive 141 is disposed between the sidewall 121 and the carrier 10.

The sidewall 121, plate 122 and sidewalls 123 may be formed in one piece. The sidewall 121 may include non-conductive material, for example but is not limited to, plastic, polymer, ceramic, glass or other suitable material. The plate 122 may include material same or similar to the sidewall 121. The plate 122 may include material different from the sidewall 121. The sidewall 123 may include material same or similar to the sidewall 121. The sidewall 123 may include material different from the sidewall 121. The conductive structure 124 may include conductive material, for example but is not limited to, copper, gold, silver or other suitable material The plate 122 is connected between the sidewall 121 and the sidewall 123. The plate 122 is disposed between an upper end (not denoted in FIG. 1) of the sidewall 121 and a lower upper end (not denoted in FIG. 1) of the sidewall 121. The plate 122 is disposed between an upper end (not denoted in FIG. 1) of the sidewall 123 and a lower end (not denoted in FIG. 1) of the sidewall 123. A conductive layer 125 or a shield layer 125 may be disposed on the plate 122. The conductive layer 125 or a shield layer 125 can function as an Electro-Magnetic Interference (EMI) shield. The conductive layer 125 or a shield layer 125 can be eliminated in some other embodiments of the subject application.

The sidewall 123 surrounds the conductive structure 124. The sidewall 123 can encloses the conductive structure 124. The sidewall 123 is in direct contact with the conductive structure 124.

The carrier 10, the lid 12 and the antenna element 16 can define a space (A and B) to accommodate or receive the electronic component 11. The space (A and B) can be separated or partitioned by the plate 122 into a space A and a space B.

The sidewall 121, the carrier 10 and the plate 122 together define a space "A" to accommodate or receive the electronic component 11. The space A may be hermetically sealed. The space A can be hermetically sealed to block moisture or water from entering the semiconductor device package 1 such that performance of the semiconductor device package 1 may not be adversely affected by the moisture. The plate 122 of the lid 12 is disposed on the electronic component 11. The plate 122 of the lid 12 covers the electronic component 11.

The antenna element 16 includes a patterned conductive layer 161, a patterned conductive layer 162, a patterned conductive layer 163 and interconnection element(s) 164. The antenna element 16 includes an antenna substrate. The antenna element 16 includes a multi-layer structure. The antenna element 16 may include more or less patterned conductive layer(s) in accordance with some other embodiments of the subject application. The patterned conductive layers 161, 162, 163 and interconnection elements 164 are disposed in dielectric material (not denoted in FIG. 1)

The patterned conductive layer 161 may include conductive material, for example but is not limited to, copper, gold, silver or other suitable material. The patterned conductive layer 162 may include material same or similar to the patterned conductive layer 161. The patterned conductive layer 162 may include material different from the patterned conductive layer 161. The patterned conductive layer 163 may include material same or similar to the patterned conductive layer 161. The patterned conductive layer 163 may include material different from the patterned conductive layer 161. The interconnection element 164 may include material same or similar to the patterned conductive layer 161. The interconnection element 164 may include material different from the patterned conductive layer 161.

The patterned conductive layer 161 may include e.g. an antenna pattern, a circuit layout, an inductor, a capacitor or other electrical components. The patterned conductive layer 161 may include, for example but is not limited to, a directional antenna. The patterned conductive layer 161 may include, for example but is not limited to, an omnidirectional antenna. The patterned conductive layer 161 may include, for example but is not limited to, an antenna array. The patterned conductive layer 161 may include, for example but is not limited to, a patch antenna. The patterned conductive layer 161 may include, for example but is not limited to, a dipole antenna. The patterned conductive layer 161 may function as a broadside coupling antenna. The patterned conductive layer 161 may function as an End-Fire radiation antenna.

The patterned conductive layer 162 may include, for example but is not limited to, a ground layer. The patterned conductive layer 162 defines a slot or aperture 162s. The slot or aperture 162s may facilitate signal coupling.

The patterned conductive layer 163 may include conductive pad(s). The patterned conductive layer 163 may include conductive trace(s). Signal(s) may be coupled between the patterned conductive layer 161 and the patterned conductive layer 163. For example, a signal (e.g. a radiation signal) received by the patterned conductive layer 161 (e.g. an antenna pattern of the patterned conductive layer 161) may be coupled to the patterned conductive layer 163, and the coupled signal may be fed to the conductive structure 124. The patterned conductive layer 163 may include feed trace(s) or feed line(s) 163f. The patterned conductive layer 163 can be exposed. The patterned conductive layer 163 can be exposed to air in the space B.

The patterned conductive layer 162 and the patterned conductive layer 163 are electrically connected by the interconnection element(s) 164. The interconnection element 164 may include a conductive via.

The antenna element 16 is attached to the lid 12 by conductive adhesive or solder material 152. The conductive adhesive or solder material 152 is disposed between the patterned conductive layer 163 of the antenna element 16 and the conductive structure 124 of the lid 12. The conductive adhesive or solder material 152 is disposed between the patterned conductive layer 163 of the antenna element 16 and the sidewall 123 of the lid 12.

The antenna element 16 is attached to the lid 12 by non-conductive adhesive 142. The conductive adhesive 142 is disposed between the antenna element 16 and the sidewall 121 of the lid 12.

The plate 122 of the lid 12, the sidewall 121 and the antenna element 16 define or form a space "B." The space "B" is defined between the plate 122 of the lid 12 and the antenna 16. The space A (or compartment A) and space B (or compartment B) are divided by the plated 122. The space B may be hermetically sealed. The space B can be hermetically sealed to block moisture or water from entering the semiconductor device package 1 (e.g. during the sawing or cutting operation) such that performance of the semiconductor device package 1 may not be adversely affected by the moisture.

The connection element 17 may include solder material or other suitable material(s). The connection element 17 is electrically connected to the carrier 10. In accordance with some embodiments of the subject application, the connection element 17 may not be electrically connected to the carrier 10. The connection element 17 is bonded or attached to conductive pads (not shown in FIG. 1) of the carrier 10.

Although it is not illustrated in FIG. 1, it is contemplated that a patterned conductive layer (which may include e.g. an antenna pattern, a circuit layout, an inductor, a capacitor or other electrical components) may be disposed on the carrier 10 in accordance with some other embodiments.

The semiconductor device package 1 may be referred to as an antenna-on-package (AoP).

The lateral surface or side surface of the lid 12 is coplanar with the lateral surface or side surface of the antenna element 16. The lateral surface or side surface of the lid 12 is coplanar with the lateral surface or side surface of the carrier 10. The lateral surface or side surface of the antenna element 16 is coplanar with the lateral surface or side surface of the carrier 10.

Figure 1A:
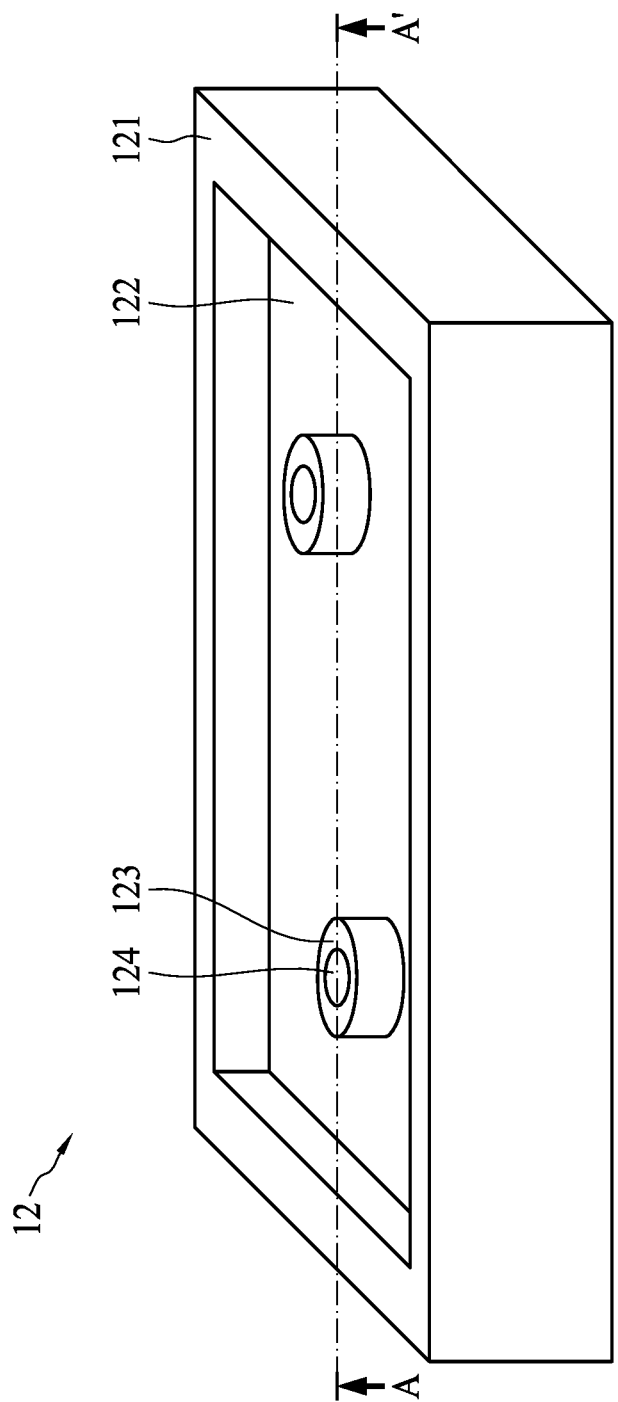
FIG. 1A is a three-dimensional (3D) view of the lid of the semiconductor device package 1 as shown in FIG. 1 in accordance with some embodiments of the subject application.

FIG. 1A is a three-dimensional (3D) view of the lid 12 of the semiconductor device package 1 as shown in FIG. 1 in accordance with some embodiments of the subject application.

The conductive structure 124 is exposed by the sidewall 123. The plate 122 and the sidewall 121 define a cavity or recess (not denoted in FIG. 1A), which helps to define the space B as shown in FIG. 1.

Figure 1B:
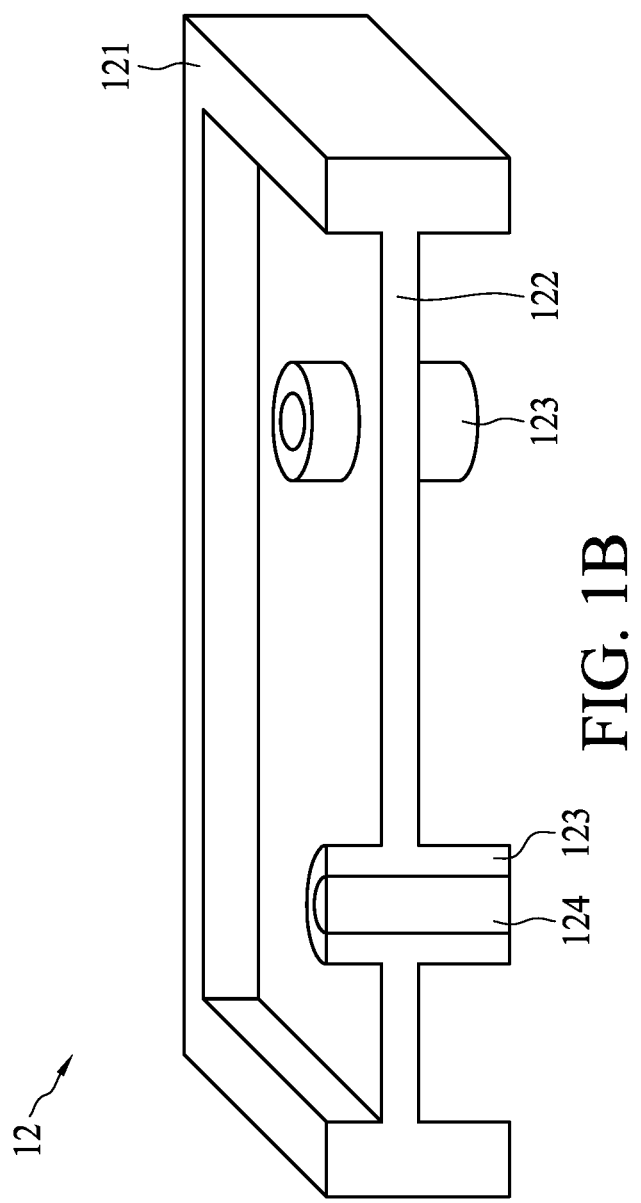
FIG. 1B illustrates a cross-sectional view of the lid across line AA' as shown in FIG. 1A in accordance with some embodiments of the subject application.

FIG. 1B illustrates a cross-sectional view of the lid 12 across line AA' as shown in FIG. 1A in accordance with some embodiments of the subject application. The plate 122, which connects the sidewall 123 to the sidewall 121, may provide support of the sidewall 123.

It is contemplated that the plate 122 may be replaced by one or some ribs in accordance with some other embodiments of the subject application. The rib(s) may also connect the sidewall 123 to the sidewall 121.

Referring back to FIG. 1, if the plate 122 is replaced by one or some ribs, the space A is in fluid communication with the space B.

Figure 2:
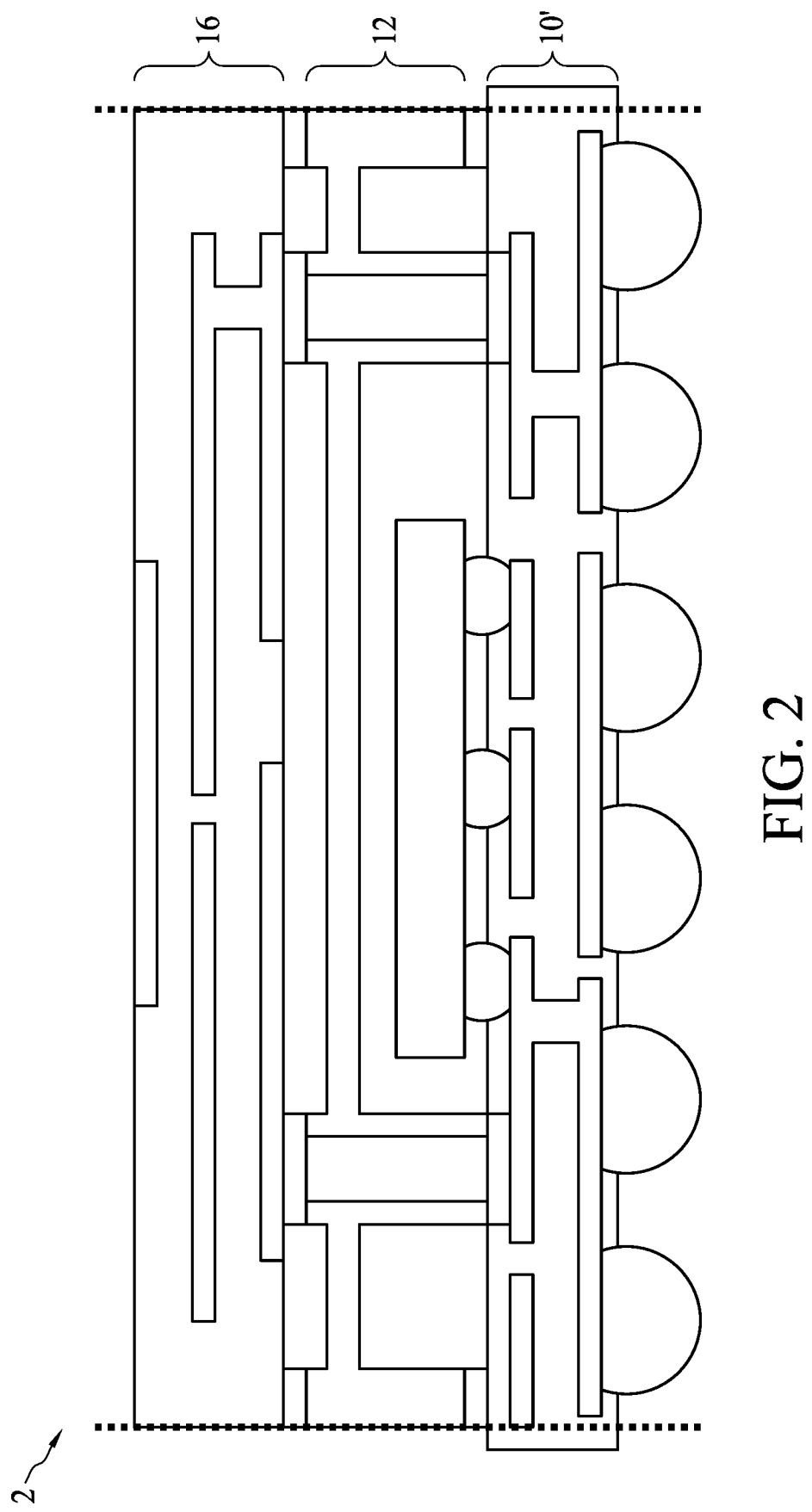
FIG. 2 illustrates another semiconductor device package in accordance with some embodiments of the subject application.

FIG. 2 illustrates another semiconductor device package in accordance with some embodiments of the subject application.

Referring to FIG. 2, the semiconductor device package 2 is similar to the semiconductor device package 1 as described and illustrated with reference to FIG. 1, except that the carrier 10 of the semiconductor device package 1 is replaced by the carrier 10' to form the semiconductor device package 2.

The carrier 10' is similar to the carrier 10 except that the carrier 10' is relatively great in size. The carrier 10' is similar to the carrier 10 except that the carrier 10' is relatively great in width. The carrier 10' has a relatively great width than the lid 12. The carrier 10' has a relatively great width than the antenna element 16. The lateral surface or side surface of the carrier 10' is not coplanar with the lateral surface or side surface of the lid 12. The lateral surface or side surface of the carrier 10' is not coplanar with the lateral surface or side surface of the antenna element 16. The lateral surface or side surface of the lid 12 is coplanar with the lateral surface or side surface of the antenna element 16.

Figure 3:
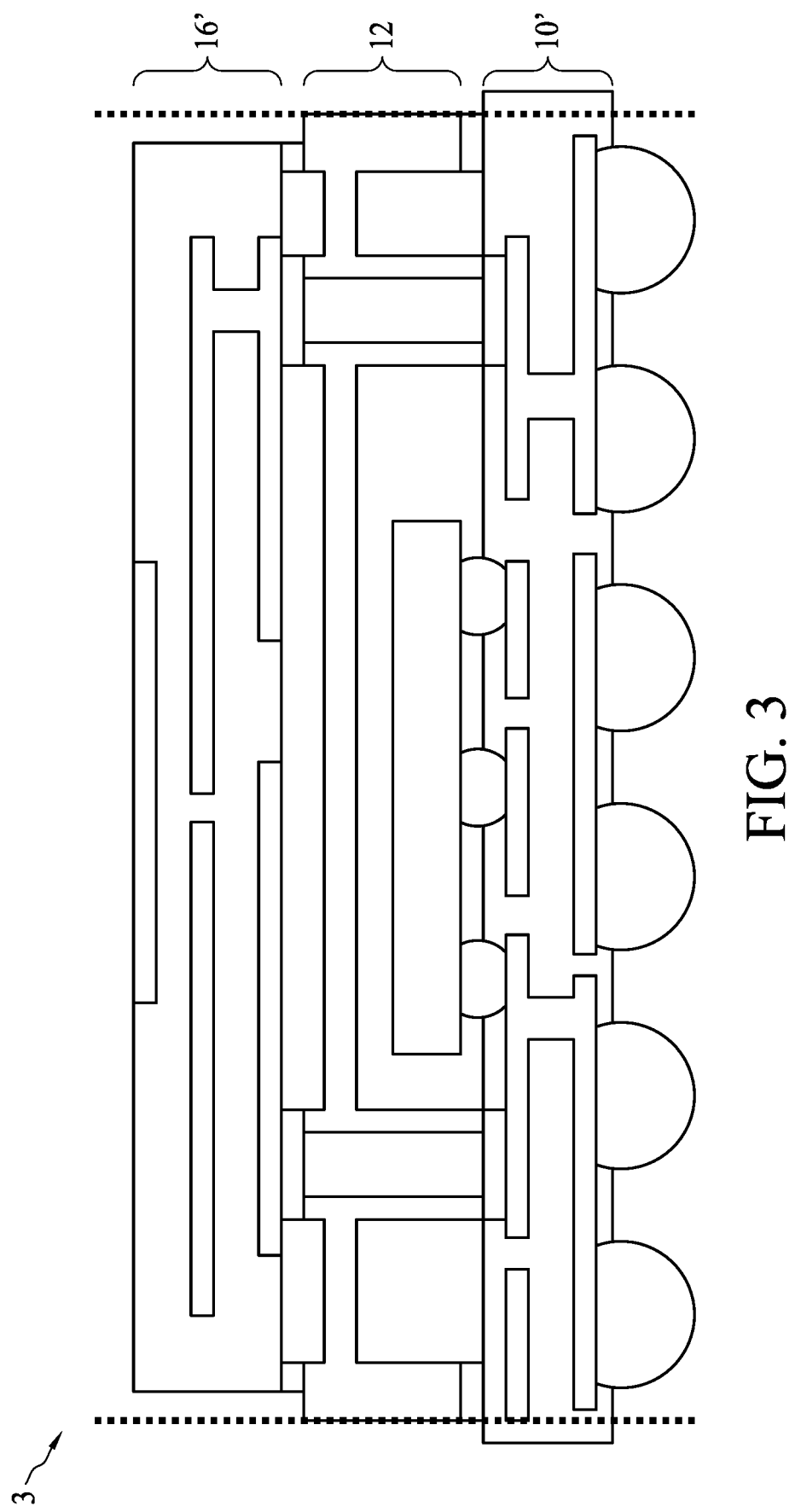
FIG. 3 illustrates another semiconductor device package in accordance with some embodiments of the subject application.

FIG. 3 illustrates another semiconductor device package in accordance with some embodiments of the subject application.

Referring to FIG. 3, the semiconductor device package 3 is similar to the semiconductor device package 2 as described and illustrated with reference to FIG. 2, except that the antenna element 16 of the semiconductor device package 2 is replaced by the antenna element 16' to form the semiconductor device package 3.

The antenna element 16' is similar to the antenna element 16 except that the antenna element 16 is relatively great in size. The lateral surface or side surface of the carrier 10' is not coplanar with the lateral surface or side surface of the lid 12. The lateral surface or side surface of the carrier 10' is not coplanar with the lateral surface or side surface of the antenna element 16'. The lateral surface or side surface of the lid 12 is not coplanar with the lateral surface or side surface of the antenna element 16'.

FIG. 4A, FIG. 4B, FIG. 4C, FIG. 4D, FIG. 4E, FIG. 4F and FIG. 4G show operations of manufacturing a semiconductor device package at various stages in accordance with some embodiments of the subject application.

Figure 4A:
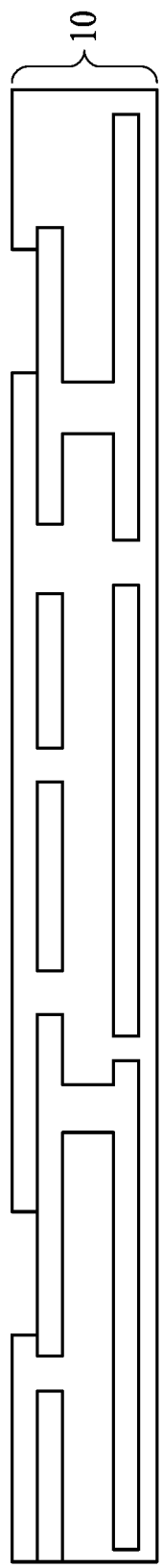

Referring to FIG. 4A, a carrier 10 as shown in FIG. 1 is prepared or provided.

Figure 4B:
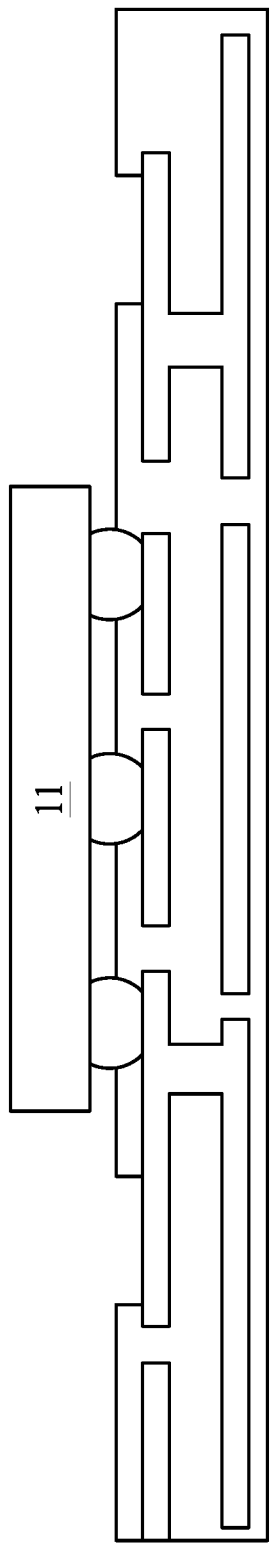

Referring to FIG. 4B, an electronic components 11 is disposed on the carrier 10.

Referring to FIG. 4C, conductive adhesive or solder material 151 is disposed on the carrier 10. The non-conductive adhesive 141 is disposed on the carrier 10.

Referring to FIG. 4D, a lid 12 is provided and ready to be attached or disposed onto the structure as shown in FIG. 4C.

Referring to FIG. 4E, the lid 12 is attached or disposed onto the carrier 10.

Referring to FIG. 4F, conductive adhesive or solder material 152 is disposed on the lid 12. The non-conductive adhesive 142 is disposed on the lid 12.

Figure 4G:
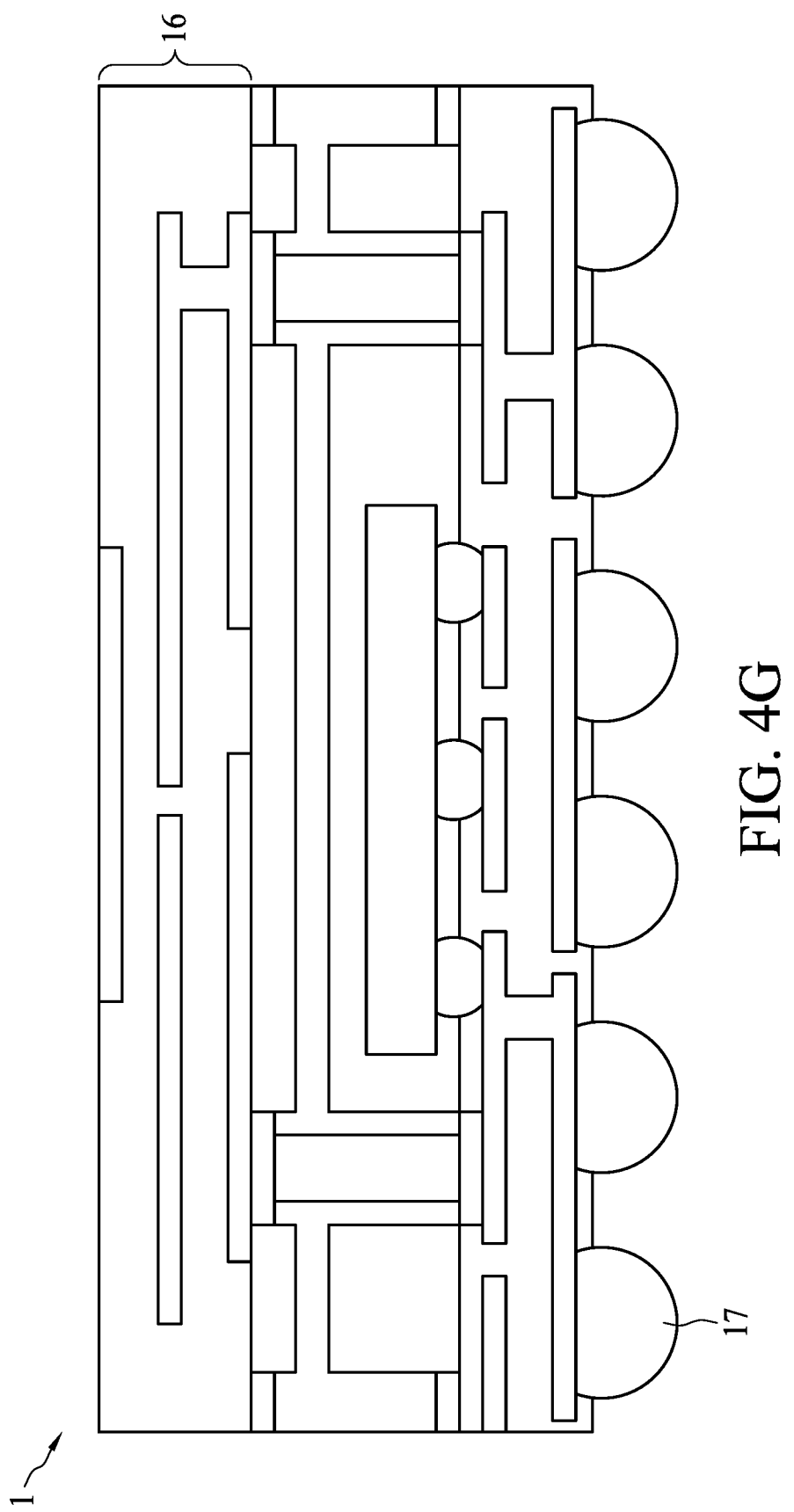

Referring to FIG. 4G, an antenna element 16 is disposed on the lid 12. Connection elements 17 are disposed on the carrier 10 to form a semiconductor device package 1 as described and illustrated with reference to FIG. 1.

Figure 5:
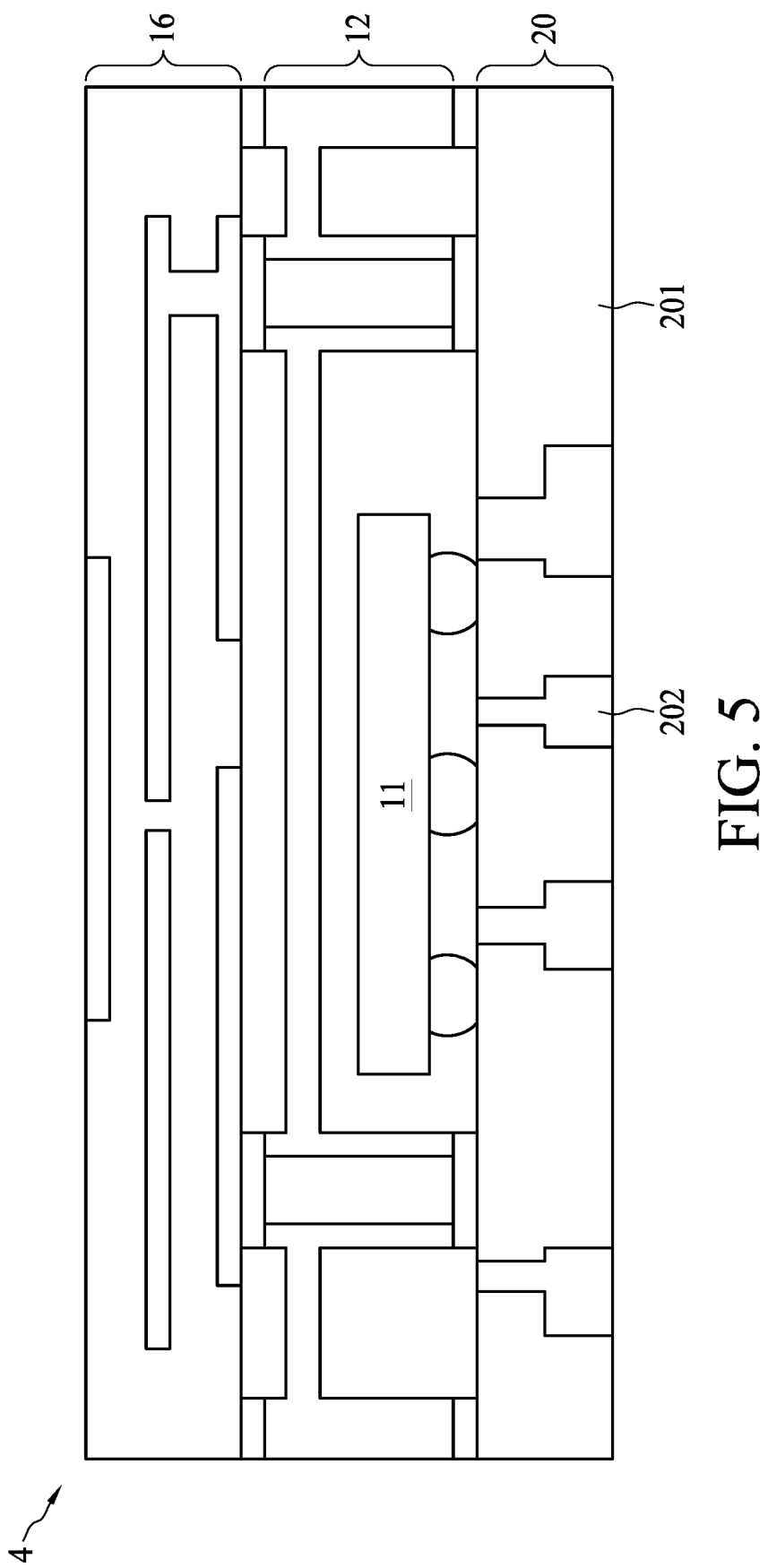
FIG. 5 illustrates another semiconductor device package in accordance with some embodiments of the subject application.

FIG. 5 illustrates another semiconductor device package in accordance with some embodiments of the subject application.

Referring to FIG. 5, the semiconductor device package 4 is similar to the semiconductor device package 1 as described and illustrated with reference to FIG. 1, except that the carrier 10 of the semiconductor device package 1 is replaced by a carrier 20 to form the semiconductor device package 4.

The carrier 20 includes a patterned conductive layer 201 and a patterned non-conductive layer 202.

The patterned conductive layer 201 may include conductive material, for example but is not limited to, copper, gold, silver or other suitable material. The patterned conductive layer 201 may include a lead frame.

The patterned non-conductive layer 202 may include non-conductive material, for example but is not limited to, dielectric material, insulation material, molding compound or molding material or other suitable material(s). The patterned non-conductive layer 202 may include resin. The patterned non-conductive layer 202 may include epoxy resin. The patterned non-conductive layer 202 may include fillers or particles (e.g. silicon oxide or other suitable materials).

Some portions of the patterned conductive layer 201 may be separated by the patterned non-conductive layer 202.

Figure 6A:
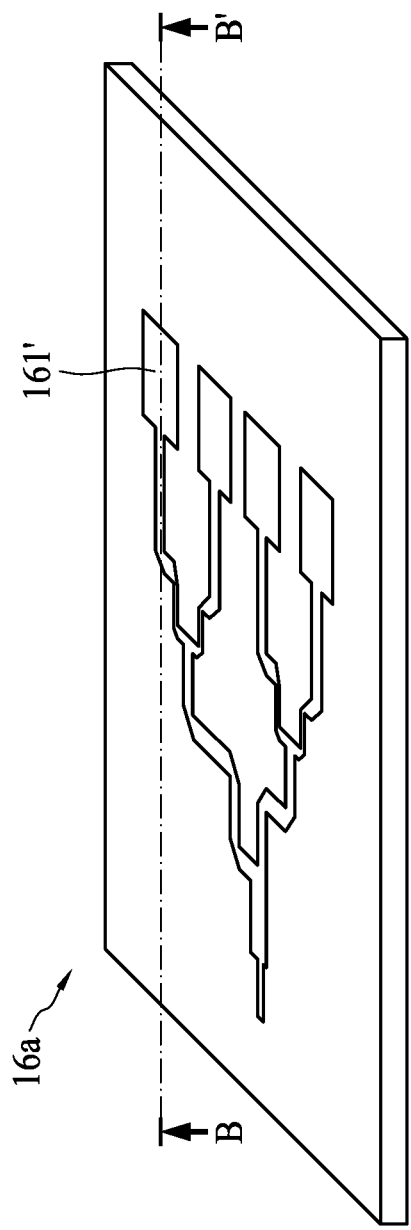
FIG. 6A illustrates an antenna element in accordance with some embodiments of the subject application.

FIG. 6A illustrates an antenna element in accordance with some embodiments of the subject application.

The antenna element 16a may have a structure different from the antenna element 16 as described and illustrated with reference to FIG. 1.

Figure 6B:
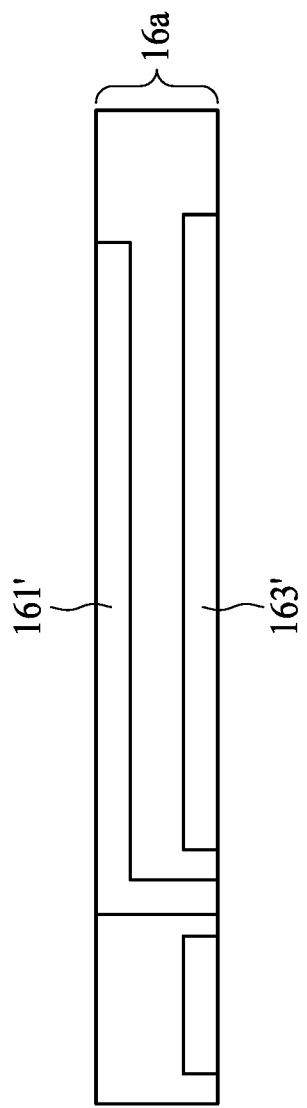
FIG. 6B illustrates a cross-sectional view of the antenna element across line BB' as shown in FIG. 6A in accordance with some embodiments of the subject application.

FIG. 6B illustrates a cross-sectional view of the antenna element 16a across line BB' as shown in FIG. 6A in accordance with some embodiments of the subject application. The antenna element 16a includes an antenna pattern 161' and a patterned conductive layer 163'.

Figure 6C:
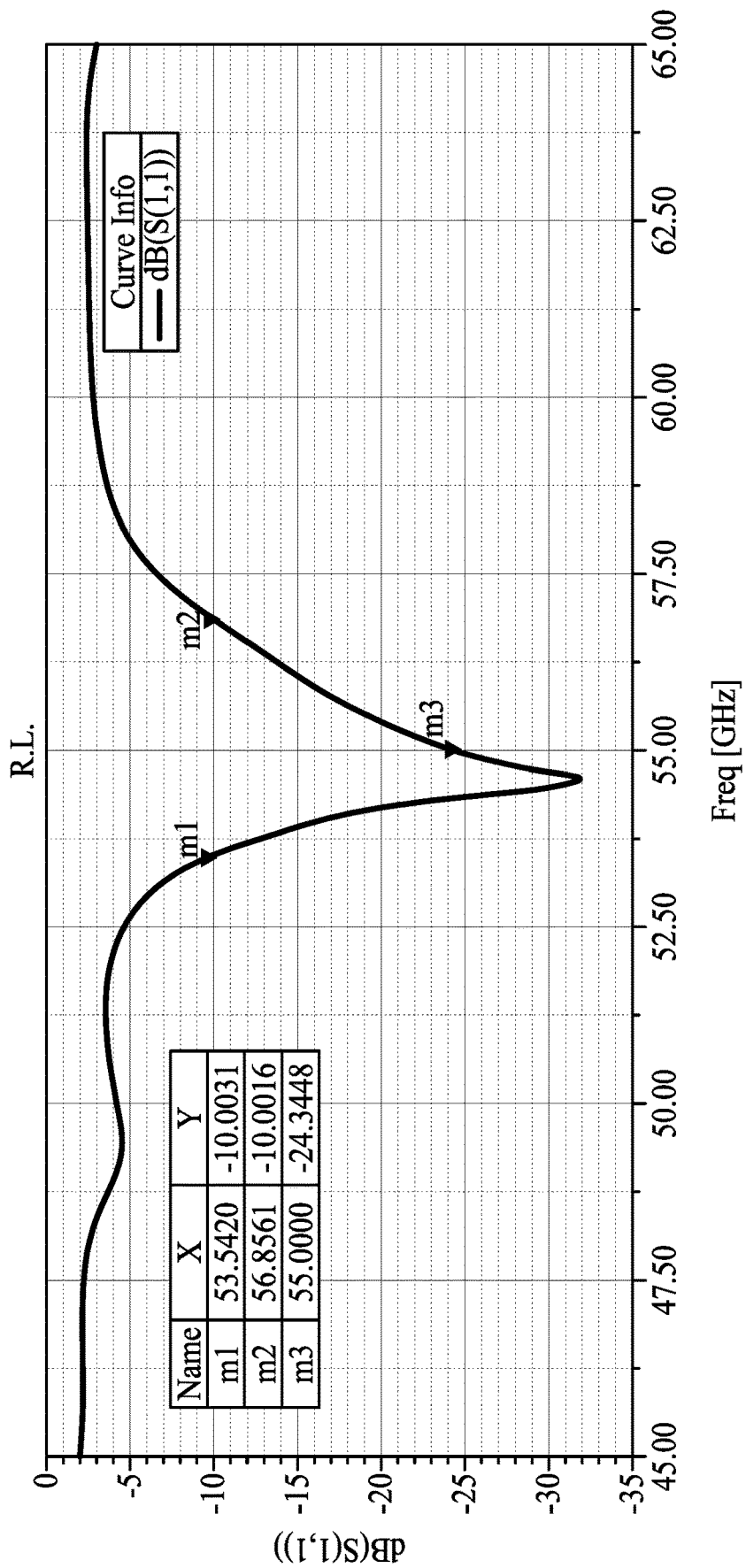
FIG. 6C illustrates an experimental result of the antenna element as shown in FIG. 6A in accordance with some embodiments of the subject application.

FIG. 6C illustrates an experimental result of the antenna element 16a as shown in FIG. 6A in accordance with some embodiments of the subject application.

Referring to FIG. 6C, the curve (not denoted in FIG. 6C) shows frequency response of the antenna element 16a as shown in FIG. 6A. The curve may represent return loss (R.L.) of the antenna element 16a. The curve may represent S-parameter $S_{11}$ of the antenna element 16a. The antenna element 16a may have a power of approximately −10.0031 dB at approximately 53.5420 GHz (see the marker m1). The antenna element 16a may have a power of approximately −10.0016 dB at approximately 56.8561 GHz (see the marker m2). The antenna element 16a may have a power of approximately −24.3448 dB at approximately 55.0000 GHz (see the marker m3).

Figure 7A:
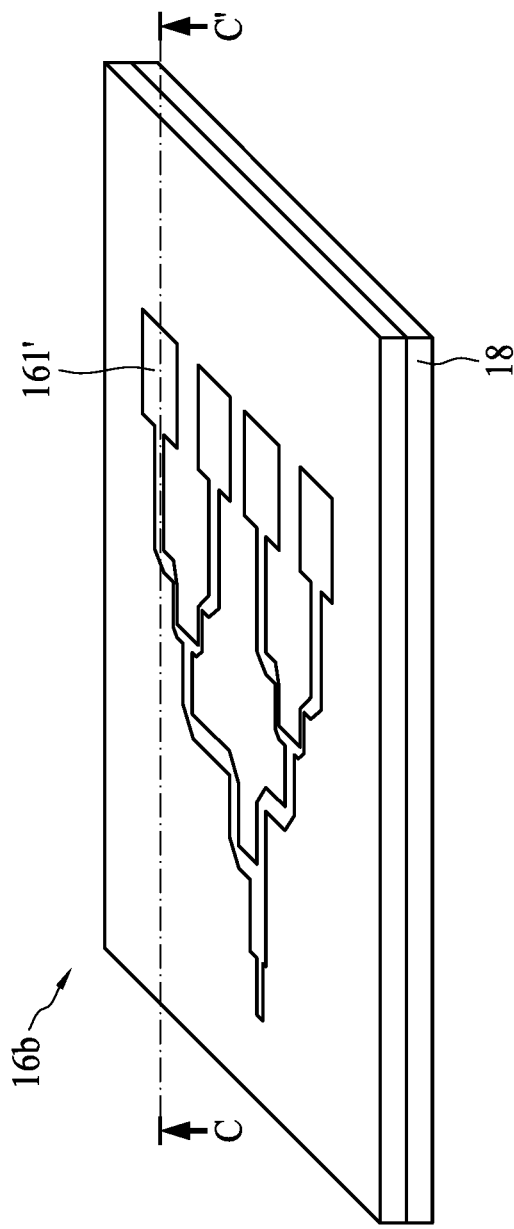
FIG. 7A illustrates another antenna element in accordance with some embodiments of the subject application.

FIG. 7A illustrates another antenna element in accordance with some embodiments of the subject application. The antenna element 16b may be similar to the antenna element 16a as described and illustrated with reference to FIG. 6A, except that the antenna element 16b further includes an insulation layer 18. The insulation layer 18 may include insulation material, for example but is not limited to, dielectric material, epoxy, resin or other suitable material(s).

Figure 7B:
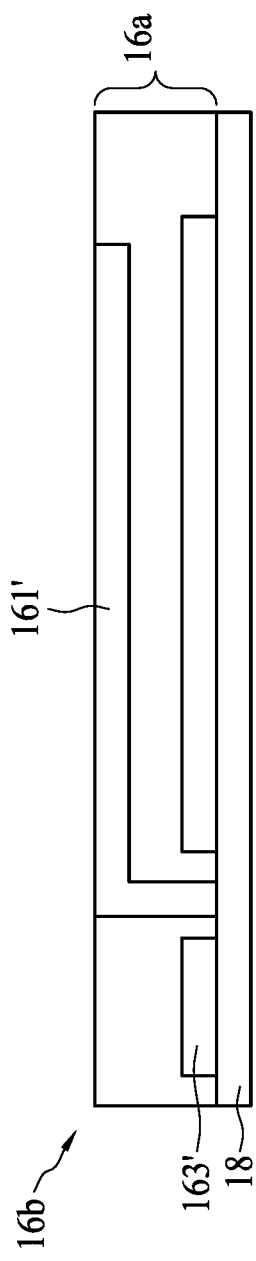
FIG. 7B illustrates a cross-sectional view of the antenna element across line CC' as shown in FIG. 7A in accordance with some embodiments of the subject application.

FIG. 7B illustrates a cross-sectional view of the antenna element 16b across line CC' as shown in FIG. 7A in accordance with some embodiments of the subject application. The insulation layer 18 is in direct contact with the antenna element 16a. The insulation layer 18 is adjacent to the antenna element 16a. The insulation layer 18 is adjacent to the patterned conductive layer 163 of the antenna element 16a.

Figure 7C:
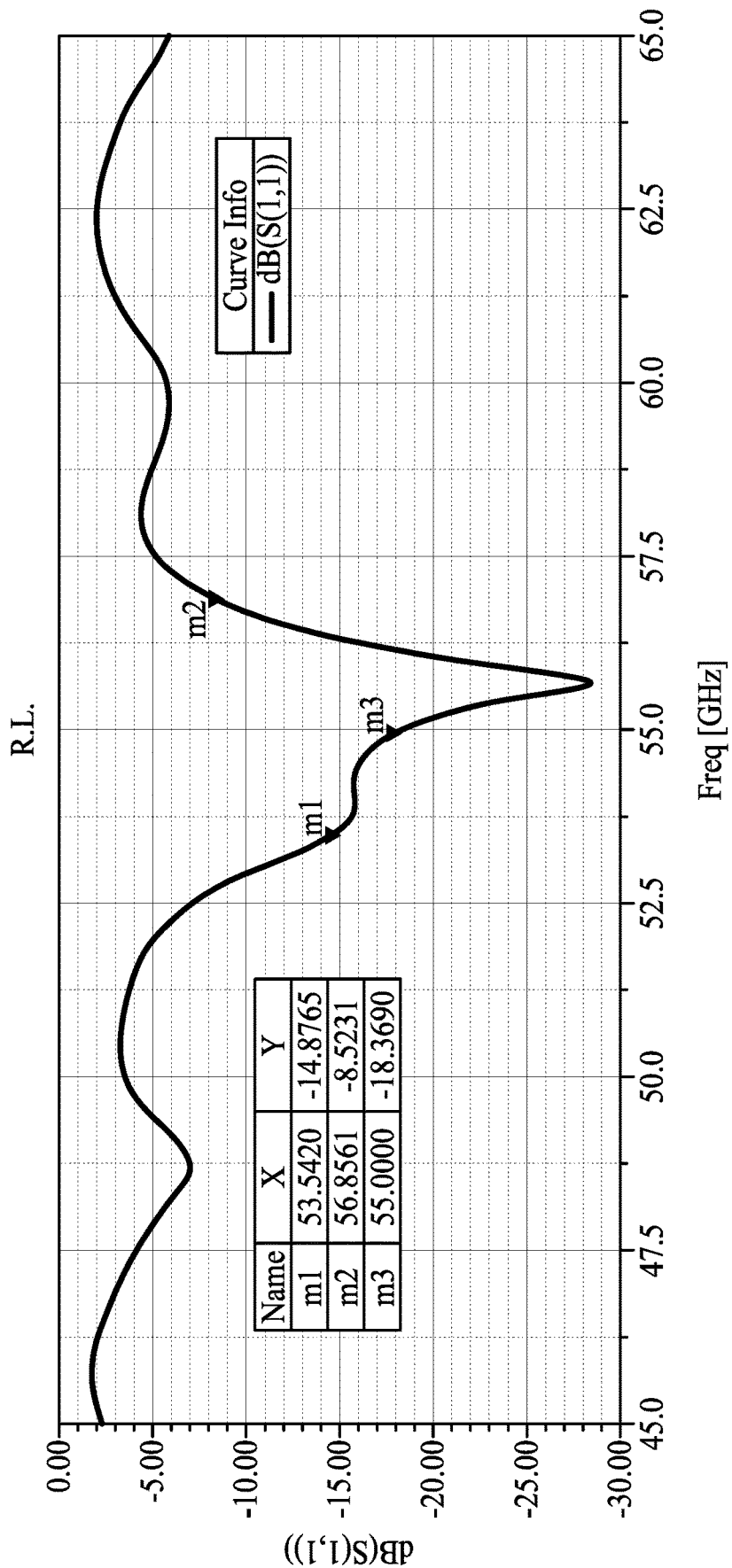
FIG. 7C illustrates an experimental result of the antenna element as shown in FIG. 7A in accordance with some embodiments of the subject application.

FIG. 7C illustrates an experimental result of the antenna element 16b as shown in FIG. 7A in accordance with some embodiments of the subject application.

Referring to FIG. 7C, the curve (not denoted in FIG. 7C) shows frequency response of the antenna element 16b as shown in FIG. 7A. The curve may represent return loss (R.L.) of the antenna element 16b. The curve may represent S-parameter $S_{11}$ of the antenna element 16b. The antenna element 16b may have a power of approximately −14.8765 dB at approximately 53.5420 GHz (see the marker m1). The antenna element 16b may have a power of approximately −8.5231 dB at approximately 56.8561 GHz (see the marker m2). The antenna element 16b may have a power of approximately −18.3690 dB at approximately 55.0000 GHz (see the marker m3). The antenna element 16b may have return loss greater than the antenna element 16a. Introduction of the insulation layer 18 may adversely affect performance of antenna element.

Figure 8A:
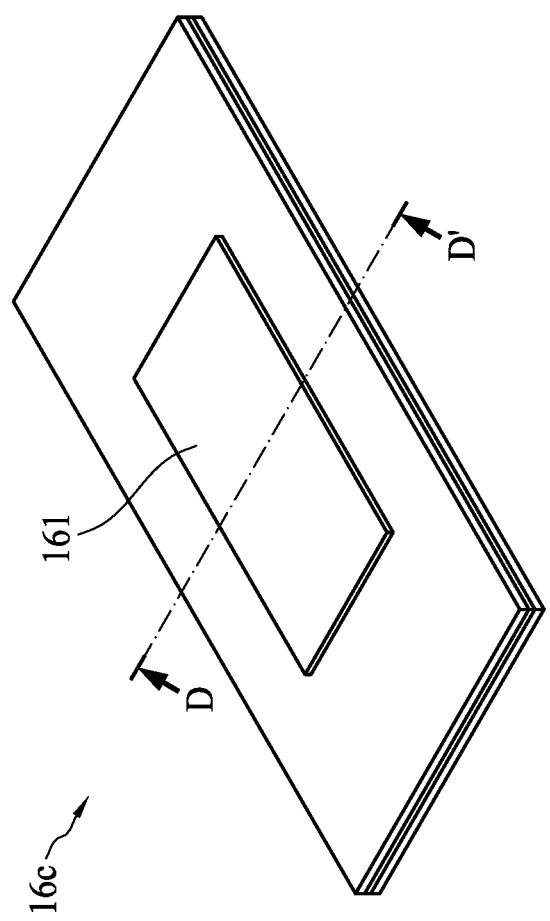
FIG. 8A illustrates another antenna element in accordance with some embodiments of the subject application.

FIG. 8A illustrates another antenna element in accordance with some embodiments of the subject application. The antenna element 16c may have a structure same or similar to the antenna element 16 as described and illustrated with reference to FIG. 1.

Figure 8B:
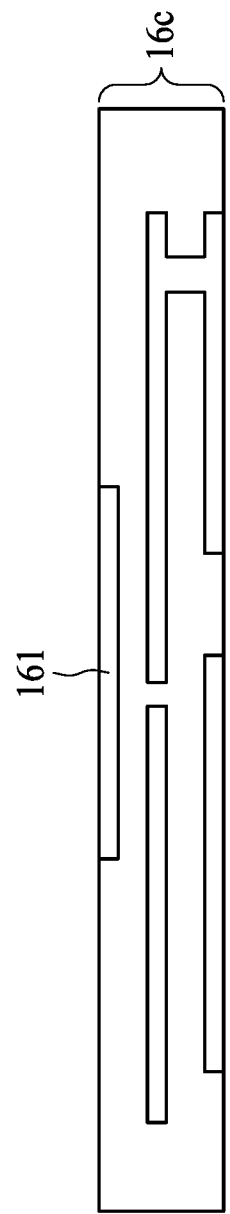
FIG. 8B illustrates a cross-sectional view of the antenna element across line DD' as shown in FIG. 8A in accordance with some embodiments of the subject application.

FIG. 8B illustrates a cross-sectional view of the antenna element 16c across line DD' as shown in FIG. 8A in accordance with some embodiments of the subject application.

Figure 8C:
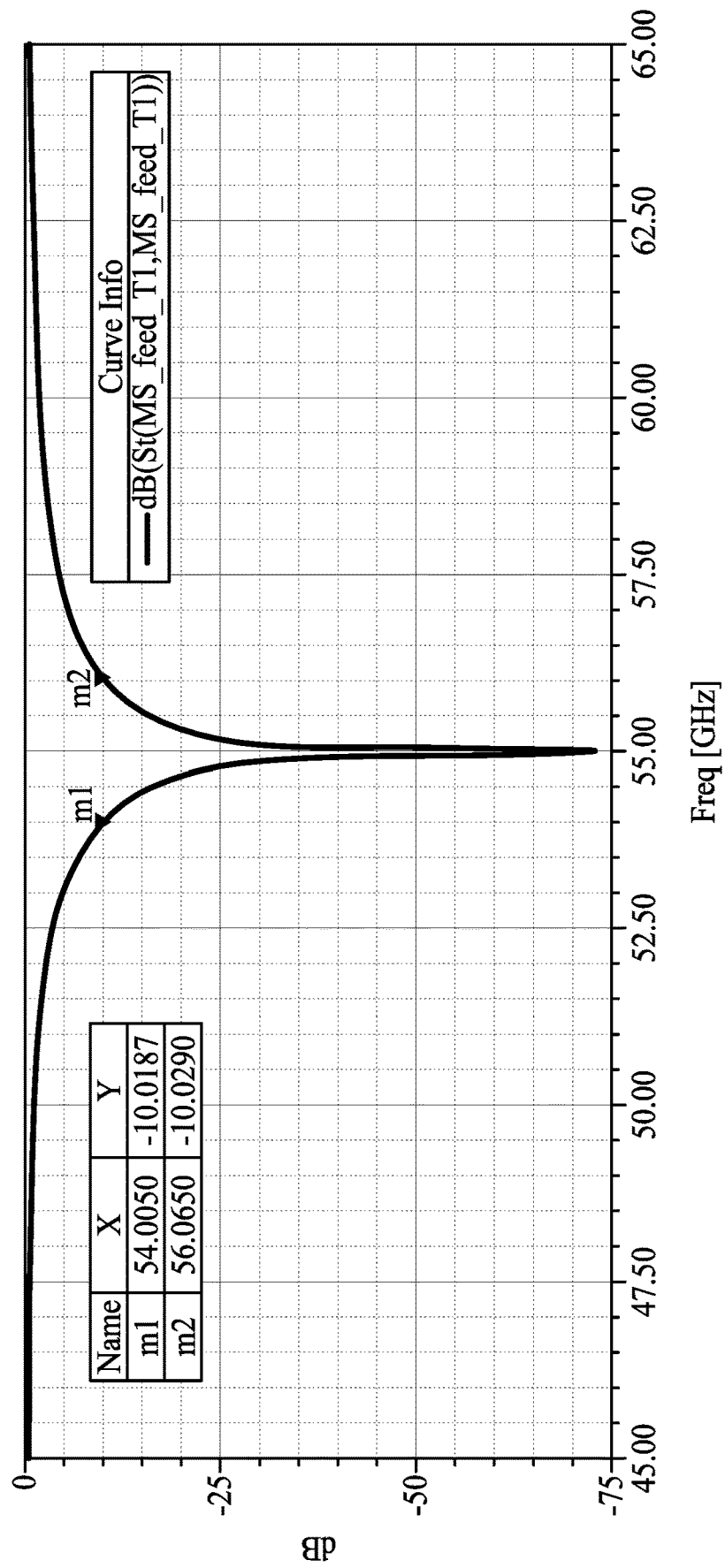
FIG. 8C illustrates an experimental result of the antenna element as shown in FIG. 8A in accordance with some embodiments of the subject application.

FIG. 8C illustrates an experimental result of the antenna element 16c as shown in FIG. 8A in accordance with some embodiments of the subject application.

Referring to FIG. 8C, the curve (not denoted in FIG. 8C) shows frequency response of the antenna element 16c as shown in FIG. 8A. The curve may represent return loss (R.L.) of the antenna element 16c. The curve may represent S-parameter $S_{11}$ of the antenna element 16c. The antenna element 16c may have a power of approximately −10.0187 dB at approximately 54.0050 GHz (see the marker m1). The antenna element 16c may have a power of approximately −10.0290 dB at approximately 56.0650 GHz (see the marker m2). The antenna element 16c may have a power of approximately −75 dB at approximately 55 GHz.

Figure 9A:
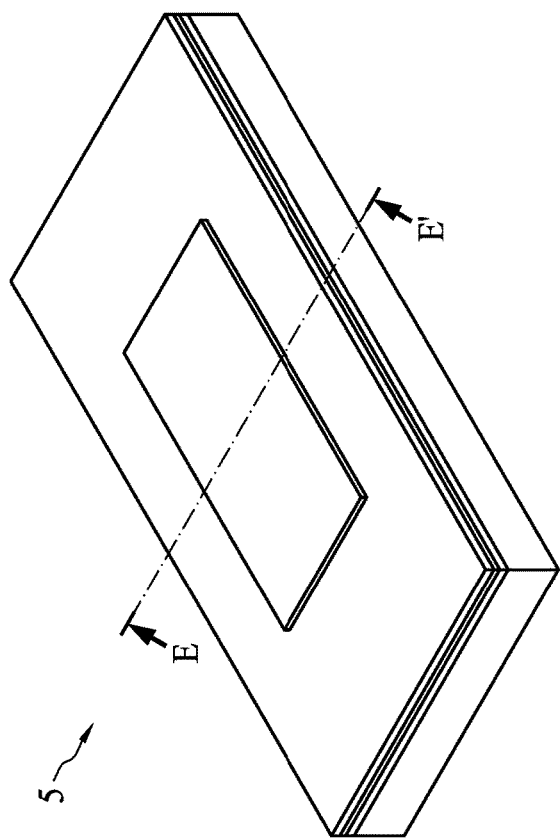
FIG. 9A illustrates another semiconductor device package in accordance with some embodiments of the subject application.

FIG. 9A illustrates another semiconductor device package 5 in accordance with some embodiments of the subject application.

Figure 9B:
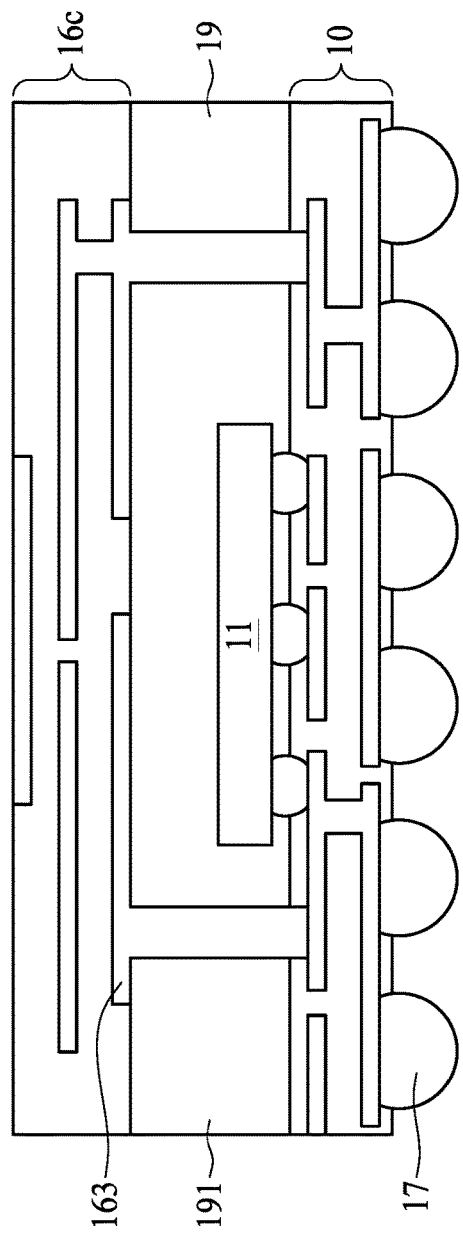
FIG. 9B illustrates a cross-sectional view of the semiconductor device package across line EE' as shown in FIG. 9A in accordance with some embodiments of the subject application.

FIG. 9B illustrates a cross-sectional view of the semiconductor device package 5 across line EE' as shown in FIG. 9A in accordance with some embodiments of the subject application.

The semiconductor device package 5 includes the carrier 10, the electronic component 11, an encapsulant 19, the antenna element 16c and connection elements 17.

The electronic component 11 is disposed on the carrier 10. The electronic component 11 is electrically connected to the carrier 10. The connection elements 17 are electrically connected to the carrier 10. The electronic component 11 is attached to the carrier 10 by the connection elements 171. The connection elements 171 are exposed to the air in the space A to mitigate dielectric loss caused by dissipation factor ($D_f$) or material loss tangent (Df). The connection elements 171 are exposed to the air in the space A to improve the forward voltage gain (which can be represented by scattering parameter $S_{21}$) of the semiconductor device package 1.

The encapsulant 19 is disposed on the carrier 10. The encapsulant 19 encapsulates the carrier 10. The encapsulant 19 encapsulates the electronic component 11. The encapsulant 19 encapsulates interconnection elements 191.

The encapsulant 19 includes but is not limited to, for example, an encapsulation material. The encapsulant 19 includes but is not limited to, for example, a molding material. The encapsulant 19 includes but is not limited to, for example, resin. The encapsulant 19 includes but is not limited to, for example, epoxy resin. The encapsulant 19 includes but is not limited to, for example, fillers or particles (e.g. silicon oxide or other suitable material(s)).

The interconnection element 191 includes conductive material, for example but is not limited to copper, gold, silver or other suitable material(s). The interconnection element 191 is electrically connected to the carrier 10. The interconnection element 191 is electrically connected to the antenna element 16c. The interconnection element 191 is electrically connected to the patterned conductive layer 163 of the antenna element 16c.

The antenna element 16c is disposed on the encapsulant 19. The antenna element 16c is in direct contact with the encapsulant 19. The encapsulant 19 is disposed adjacent to the patterned conductive layer 163 of the antenna element 16c.

Figure 9C:
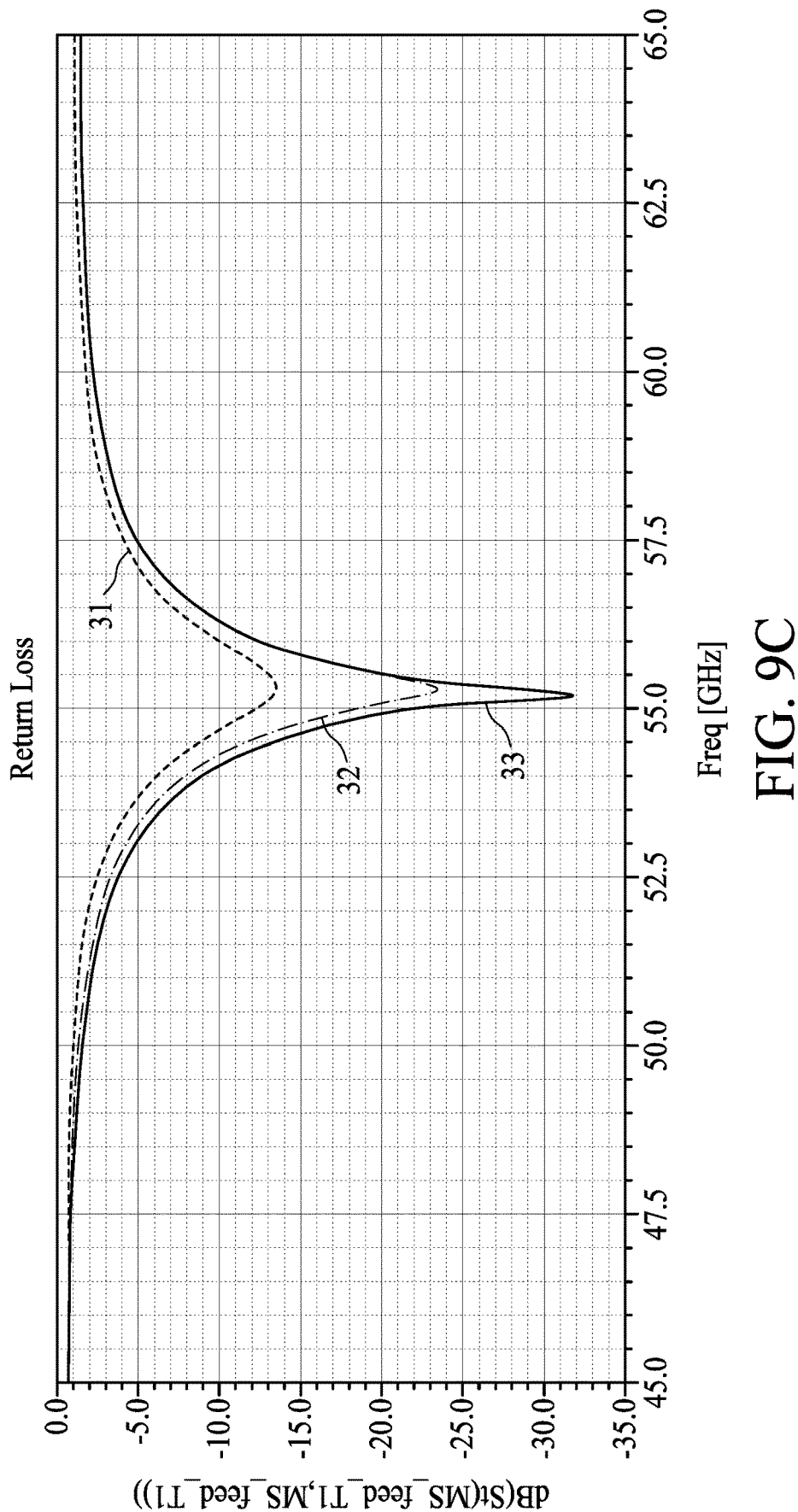
FIG. 9C illustrates experimental results of various semiconductor device packages in accordance with some embodiments of the subject application.

FIG. 9C illustrates experimental results of various semiconductor device packages in accordance with some embodiments of the subject application.

Referring to FIG. 9C, the curve 31 shows frequency response of the semiconductor device package 5 as shown in FIG. 9A. The curve 32 shows frequency response of the semiconductor device package 1 as shown in FIG. 1, where a distance between the antenna element 16 and the plate 122 is substantially identical to a thickness of the patterned conductive layer 163. The curve 33 shows frequency response of the semiconductor device package 1 as shown in FIG. 1, where a distance between the antenna element 16 and the plate 122 is substantially twice, double or two times the thickness of the patterned conductive layer 163.

The curve 31 may represent return loss (R.L.) of the semiconductor device package 5. The curve 32 may represent return loss (R.L.) of the semiconductor device package 1. The curve 33 may represent return loss (R.L.) of the semiconductor device package 1.

The curve 31 may represent S-parameter $S_{11}$ of the semiconductor device package 5. The curve 32 may represent S-parameter $S_{11}$ of the semiconductor device package 1. The curve 33 may represent S-parameter $S_{11}$ of the semiconductor device package 1.

Comparing the curve 31 to the curve 32, the semiconductor device package 1, which has a space B between the antenna element 16 and the plate 122, may have a relatively less return loss than the semiconductor device package 5.

Comparing the curve 32 to the curve 33, the semiconductor device package 1 may have a relatively less return loss with a relatively wide space B in elevation.

Figure 10:
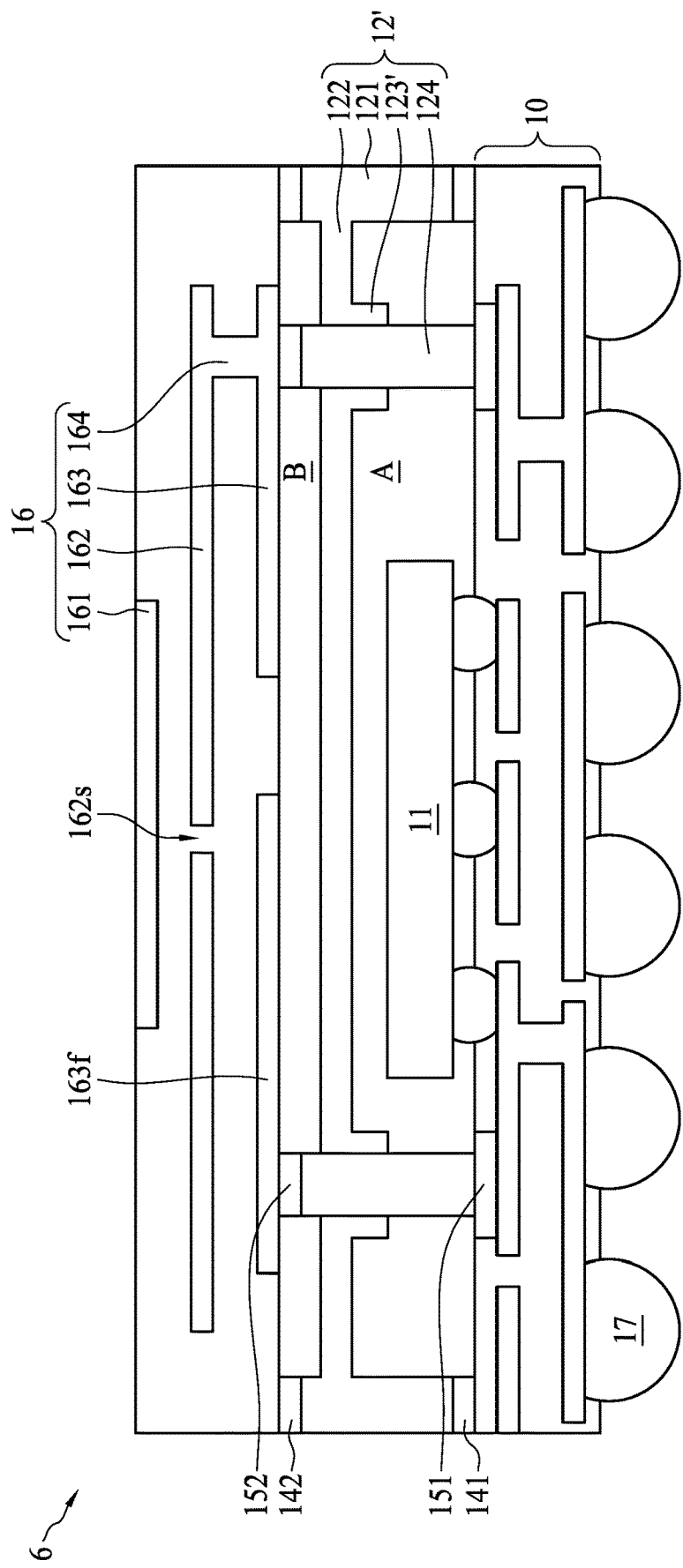
FIG. 10 illustrates another semiconductor device package in accordance with some embodiments of the subject application.

FIG. 10 illustrates another semiconductor device package in accordance with some embodiments of the subject application.

Referring to FIG. 10, the semiconductor device package 6 is similar to the semiconductor device package 1 as described and illustrated with reference to FIG. 1, except that the lid 12 of the semiconductor device package 1 is replaced by the lid 12' to form the semiconductor device package 6.

The lid 12' is similar to the lid 12 as described and illustrated with reference to FIG. 1, except that the sidewall 123 of the lid 12 is replace by the sidewall 123'. The sidewall 123' is connected to the plate 122. The sidewall 123' surrounds the conductive structure 124. The sidewall 123' can enclose the conductive structure 124. The sidewall 123' surrounds a part of the conductive structure 124. The sidewall 123' can enclose a part of the conductive structure 124. The sidewall 123' surrounds the conductive structure 124. The sidewall 123' exposes the conductive structure 124. The sidewall 123' exposes a part of the conductive structure 124. The sidewall 123' exposes a part of a side surface (not denoted in FIG. 10) of the conductive structure 124. The sidewall 123' extends from the plate 122. The sidewall 123' is less than the conductive structure 124 in length. The sidewall 123' is spaced from the antenna element 16. The sidewall 123' is spaced from the carrier 10. Less contact area between the sidewall 123' and the conductive structure 124 can improve the forward voltage gain (which can be represented by scattering parameter $S_{21}$) of the semiconductor device package 6.

As used herein, the terms "substantially," "approximately" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two surfaces can be deemed to be coplanar or substantially coplanar if a displacement between the two surfaces is no greater than 5 µm, no greater than 2 µm, no greater than 1 µm, or no greater than 0.5 µm.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor device package, comprising:
   a carrier;
   an antenna element disposed on the carrier, the antenna element comprising a patterned conductive layer;
   an electronic component; and
   a conductive structure disposed between the carrier and the antenna element, and electrically connecting the electronic component to the carrier, wherein the carrier and the conductive structure define an air space exposing a portion of the patterned conductive layer to accommodate the electronic component.

2. The semiconductor device package of claim 1, wherein the antenna element has a first thickness, and a height of the air space is greater than or equal to twice the first thickness.

3. The semiconductor device package of claim 1, wherein the portion of the-patterned conductive layer of the antenna element is exposed to air in the air space and facing the electronic component.

4. The semiconductor device package of claim 1, further comprising a connection element to connect the electronic component to the carrier, wherein the connection element is exposed to air in the air space.

5. The semiconductor device package of claim 1, further comprising a plate between the portion of the-patterned conductive layer of the antenna element and the electronic component.

6. The semiconductor device package of claim 5, wherein the plate separates the air space into a first space around the electronic component and a second space exposing the portion of the-patterned conductive layer.

7. The semiconductor device package of claim 6, wherein the portion of the-patterned conductive layer of the antenna element has a first thickness, and a height of the second space is greater than or equal to twice the first thickness.

8. The semiconductor device package of claim 5, further comprising a conductive layer on the plate and between the portion of the patterned conductive layer and the electronic component, wherein the conductive layer is configured to block electro-magnetic interference (EMI) between the patterned conductive layer and the electronic component.

9. The semiconductor device package of claim 5, further comprising a sidewall being surrounding the conductive structure and connected to the plate.

10. The semiconductor device package of claim 9, wherein the sidewall exposes a part of a side surface of the conductive structure.

11. The semiconductor device package of claim 5, further comprising a sidewall connected to the conductive structure by the plate.

12. The semiconductor device package of claim 6, wherein the first space is hermatically sealed.

13. The semiconductor device package of claim 1, further comprising a rib between the antenna element and the electronic component.

14. A semiconductor device package, comprising:
    a carrier;
    an antenna element disposed on the carrier, the antenna element comprising a patterned conductive layer;
    an electronic component; and
    a lid disposed between the carrier and the patterned conductive layer of the antenna element, wherein a space between the lid and the patterned conductive layer exposes the patterned conductive layer.

15. The semiconductor device package of claim 14, wherein the lid comprises a conductive structure and a plate connected to the conductive structure, wherein a width of the plate is substantially equal to a width of the antenna element.

16. The semiconductor device package of claim 15, further comprising a sidewall being surrounding the conductive structure and connected to the plate.

17. The semiconductor device package of claim 16, wherein the sidewall exposes a part of a side surface of the conductive structure.

18. The semiconductor device package of claim 6, wherein the second space is hermatically sealed.

19. The semiconductor device package of claim 13, wherein the rib separates the air space into a first space and a second space on the first space.

20. The semiconductor device package of claim 15, wherein the carrier and the conductive structure define an air space to accommodate the electronic component.

* * * * *